United States Patent [19]
Hakozaki

[11] 3,946,363
[45] Mar. 23, 1976

[54] VARIABLE TIME AXIS CONTROLLER IN SIMULATION COMPUTER

[75] Inventor: Hiroshi Hakozaki, Fujisawa, Japan

[73] Assignee: Mitsui Shipbuilding & Engineering Co., Ltd., Tokyo, Japan

[22] Filed: Jan. 31, 1974

[21] Appl. No.: 438,394

[30] Foreign Application Priority Data
Feb. 6, 1973  Japan............................ 48-14225

[52] U.S. Cl....... 340/172.5; 235/92 DP; 235/92 CC; 235/92 PE
[51] Int. Cl.²...................... G06F 1/04; G06G 7/00
[58] Field of Search . 340/172.5; 235/92 DP, 92 PE, 235/92 CC, 92 R, 152, 153 AC

[56] References Cited
UNITED STATES PATENTS

| | | | |
|---|---|---|---|
| 3,377,471 | 4/1968 | Althaus et al...................... | 235/152 |
| 3,403,384 | 9/1968 | Cushing et al.................. | 340/172.5 |
| 3,715,573 | 2/1973 | Vogelsberg...................... | 340/172.5 |
| 3,715,728 | 2/1973 | Fontaine......................... | 340/172.5 |
| 3,729,129 | 4/1973 | Fletcher.......................... | 235/92 R |
| 3,764,992 | 10/1973 | Milne............................... | 340/172.5 |
| 3,843,873 | 10/1974 | Beville et al..................... | 235/92 R |

*Primary Examiner*—Gareth D. Shaw
*Assistant Examiner*—James D. Thomas
*Attorney, Agent, or Firm*—Charles W. Helzwer

[57] ABSTRACT

In a simulator of the class which is operated repeatedly according to the same program there are provided a mini-computer, a time axis controller and a communicating device. The time axis controller provides a pulse to the mini-computer for controlling the timing of the programmed processing operation thereof and is provided with means for manually varying the period of the pulse thereby to vary the timing of the programmed processing operation while observing the content of the display provided by the communicating device.

1 Claim, 3 Drawing Figures

VARIABLE TIME AXIS CONTROLLER IN SIMULATION COMPUTER

BACKGROUND OF THE INVENTION

This invention relates to a simulator. A simulator is generally used to obtain operating data in a case where it is impossible to obtain operating data by actually operating a machine or apparatus which has been designed and manufactured. In such a case, a simulator is operated repeatedly according to the same program and the result is used to modify or change the design of the machine or apparatus or the program. Although many types of electronic simulators have been developed, most of them are of the batch process system utilizing a large size electronic computer in order to increase the processing speed and to use it in fields requiring complicated processing operations.

However, a simulator of such a type produces only an output regarding whether the machine or apparatus being simulated operates normally or not with the present design, or the final result indicating which portion of the machine or apparatus is defective. There are many difficulties in such cases requiring communications as in a case where it is desired to observe the progress of the simulation or in a case where it is desired to change the method of simulation during the use of the simulator. More particularly, in order to satisfy such requirements with a batch processing system utilizing a large electronic computer, it is necessary to form a new program which of course requires a considerable time and labor and is not efficient. Further, in such a system, the number of words used is limited and it is almost impossible to change the words so that it is extremely difficult to form a desired program by using words of the limited number. Moreover, as the simulating system of this type is bulky it is expensive and difficult to purchase.

SUMMARY OF THE INVENTION

It is an object of this invention to provide an improved simulator capable of making communications for observing the progress of the simulation or changing the simulation during the operation of the simulator.

Another object of this invention is to provide an improved simulator which enables to readily form a desired simulation.

Still another object of this invention is to provide an inexpensive simulator.

According to this invention these and other objects can be accomplished by providing a simulator which is operated repeatedly according to the same program, characterized is that there are provided a mini-computer, a time axis controller and a communicating device which are connected to the mini-computer, that the time axis controller provides a pulse to the mini-computer for controlling a timing of the programmed timing operation thereof and that the time axis controller is provided with means for manually varying the period of the pulse thereby enabling the operator to vary the timing of the programmed timing operation while observing the effect of the timing variation on the display provided by the communicating device.

The time axis controller which is the characterizing element of this invention comprises an up-counter, a pulse generator for supplying a pulse of a predetermined period to the up-counter through a first gate circuit, a monostable multivibrator connected to the output of the up-counter, a second gate circuit responsive to the output of the monostable multivibrator for controlling the input to the up-counter, an up-down counter connected to supply its output to the second gate circuit and to count the control pulse supplied from the mini-computer through a third gate circuit, and a rotary variable pulse generator connected to the up-down counter through a fourth gate circuit and including manually operated means for varying the frequency of the pulse generated thereby. The first and third gate circuits are connected to be controlled by the control signal from the mini-computer while the fourth gate circuit is connected to be manually controlled.

BRIEF DESCRIPTION OF THE DRAWING

In the accompanying drawing.

DESCRIPTION OF THE PREFERRED EMBODIMENT

Figure 1:
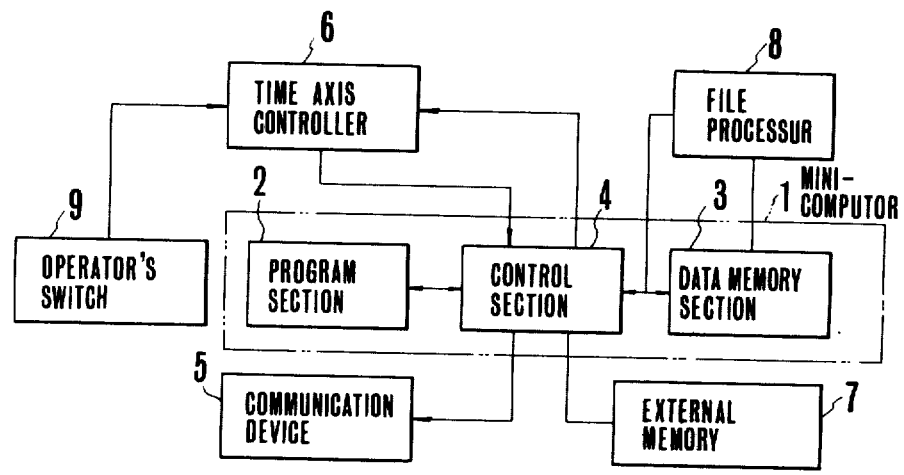
FIG. 1 is a block diagram illustrating one embodiment of the simulator embodying the invention.

The simulator illustrated in FIG. 1 comprises a mini-computer 1, only the elements thereof directly related to this invention being shown. The term "mini-computer" is used herein to mean a small size, commercially available, electronic computer such as the PDP11 microcomputer manufactured and sold by the Digital Equipment Corporation (DEC). Other similar minicomputers could be used which contain a binary program having a storing capacity of from 1 K word to 32 K words, with each word consisting of from 8 to 18 bits, and which can be purchased at a price of less than 25,000 United States dollars. As shown, the mini-computer 1 comprises a program section 2 utilizing magnetic cores, for example, as the memory elements for storing any desired simulation program, a data memory section 3 utilizing magnetic cores, for example, for storing magnetic data, and a control section 4 for producing various control signals in response to a program read out from the program section 2 or in response to input information supplied from the time axis controller. The control section may have a software like construction utilizing magnetic cores or a hardware like construction. In this example, the control section 4 is constructed to have a capability of producing random numbers. There is also provided a communication device 5 which displays data or the results of various control information inputs on the output obtained from the mini-computer 1. The communication device 5 may be constituted by a graphic display device, character display device or a console typewriter or the like. If desired, the communication device 5 may be constructed to have a capability of supplying control information back to the mini-computer 1.

Figure 2:
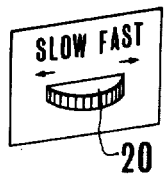
FIG. 2 is a perspective view showing a dial knob.

In addition to the above, a time axis controller 6 is provided as an external, operator controlled input circuit to the mini-computer 1. The time axis controller 6 is constructed to produce a pulse of any desired period for processing a program by manual operation of an operator or in accordance with the control information supplied from the program section 2 to the control section 4 of the mini-computer 1. Also the time axis controller 6 is connected to be controlled when the operator manipulates a dial knob 20 as shown in FIG. 2. Thus, when the operator turns the knob 20 toward "slow" the time controller 6 generates a low frequency pulse, whereas when the knob is turned toward "high" a high frequency pulse will be formed. If desired, or when the memory capacity of the mini-computer 1 is not sufficiently large, an external memory device 7 of the desk, drum or tape type may be used. A file processor 8 acting as an external data control circuit for the mini-computer 1 is connected to the data memory section 3. The file processor 8 may take the form of a computer for searching the data stored in data memory section 3 that satisfies a designated condition and functions to process at a high speed the simulation data and generates an output for supply to control section 4 that varies as the progress of simulation proceeds. Numeral 9 shows an operator's switch provided with the rotary knob 20.

The simulator described above operates as follows.

During the operation of the mini-computer 1, the communicating device 5 displays the flow of information through control section 4. The time axis controller 6 is driven by the control section 4 on one hand and controlled by the knob 20 manipulated by the operator on the other hand for sending a timing pulse to the control section 4 whereby the control section 4 functions to adjust the timing. In other words, the flow of information to be displayed by the communicating device 5 maybe adjusted by the operator. For this reason, by manipulating the operator's switch 9 it is possible to vary the speed of the progress of the operation which is to be displayed by the communicating device 5 by adjusting the time axis controller 6. When the operator wishes to read accurately the progress of the operation which is displayed by the communication device 5, he turns the knob 20 toward "slow" thereby decelerating the operating speed of the time axis controller 6 thus displaying at a lower speed the progress of the operation.

Figure 3:
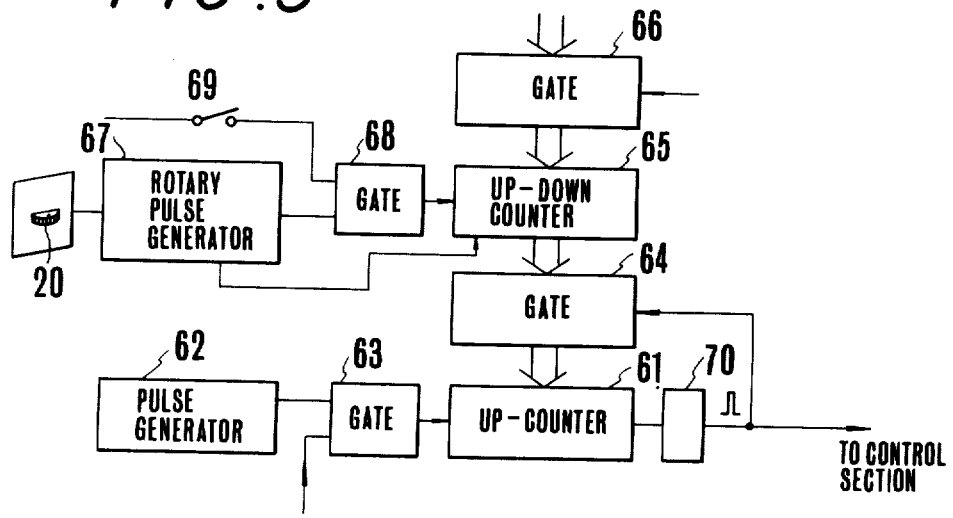
FIG. 3 is a block diagram showing one example of the variable time axis controller utilized in the embodiment shown in FIG. 1.

One example of the time axis controller 6 shown in FIG. 3, which characterizes the invention, comprises an up-counter 61 connected to receive an electric pulse from a pulse generator 62 through an AND gate circuit 63 whose other input is connected to receive a control signal from the mini-computer, an up-down counter 65 connected to supply a signal to the up-counter 61 through a gate circuit 64 and a gate circuit 66 controlled by a control signal from the mini-computer for supplying a signal from a center processor (not shown) of the mini-computer to the up-down counter 65. There is also provided a rotary variable pulse generator 67 which is constructed to continuously adjust the period of the pulse generated thereby by turning knob 20 shown in FIG. 2. The output from the rotary pulse generator 67 is applied to the up-down counter 65 through an AND gate circuit 68 whose other input is connected to a source not shown, through a switch 69. The output from the up-counter 61 is supplied through an output terminal to control section 4 and back to one input of gate circuit 64 through a monostable multivibrator 70.

In operation, when switch 69 is maintained off, up-counter 61 is set by the signal supplied from the central processor (not shown) of the mini-computer 1 through gate circuit 66, up-down counter 65 and gate circuit 64 so that the up-counter 61 will periodically send the pulse signal supplied thereto from the pulse generator 62 through gate circuit 63 which has been enabled by the control signal from the mini-computer to the control section 4 thereby timing the operation thereof. Thereafter, when the switch 69 is closed to enable gate circuit 68 and when the output of the rotary pulse generator 67 is set to an up or down state by adjusting knob 20, the operation of the up-down counter 65 is controlled accordingly, thereby varying the setting of the up-counter 61. Accordingly, the output from the up-counter 61 changes the timing of the control section 4 to a suitable value. Concurrently therewith, the monostable multivibrator 70 supplies a portion of the output signal applied to the control section 4 to gate circuit 64 thus disenabling the same for controlling the signal supplied from the up-down counter 65.

Thus, the invention provides an improved simulator in which various operations such as a slow motion, a rapid motion, an actual time and a momentary stop can be varied as desired either by a program or an external circuit thereby permitting detailed investigation and check during the progress of the simulation as well as the reversal of the timing. Accordingly, it is possible to make constant supervision of the operation of an object to be simulated as well as the informations regarding the simulation. Further, as it is possible to supervise a large quantity of the simulation data by a hardware designed to be used exclusively for this purpose an economical mini-computer can be used instead of a large computor as in the prior art simulators.

What is claimed is:

1. A time axis controller for use in a simulator of the type wherein said simulator comrises a programmable mini-computer capable of performing a predetermined simulation program stored therein and having a control section and a time axis controller connected thereto for additionally controlling the timing of programmed processing operations of said mini-computer, and a communication device connected to said mini-computer for visually providing the results obtained while performing a simulation program, the improvements wherein said time axis controller comprises a fixed frequency pulse generator for supplying pulses of predetermined period, an up-counter of preset type for counting said pulses from said pulse generator, a monostable multivibrator having its input connected to the output of said up-counter and having its output connected as an input to the control section of the mini-computer, a gate circuit having a first input connected respectively to the output from said monostable multivibrator and having its output connected to the setting input of said up-counter, an up-down counter having its output connected to a second input of said gate circuit and having a first input connected to a source of control pulses supplied from said mini-computer, said control pulses comprising the data for determining a programmed simulation operation, a variable pulse generator connected to a second input of said up-down counter and including manually operated means for varying the frequency of the pulses generated by the variable pulse generator, and means for enabling said up-down counter to be additionally controlled manually whereby upon said manually operated means being operated, the variable frequency pulses supplied by said variable pulse generator to said up-down counter varies the frequency of the pulses supplied by said up-down counter to said up-counter and the frequency of the pulses supplied by said up-counter to said monostable multivibrator to thereby vary the frequency of the pulses supplied by said monostable multivibrator to the control section of said mini-computer for controlling the timing of programmed simulation processing operations of the mini-computer.

* * * * *